(12) United States Patent
Van de Kerkhof et al.

(10) Patent No.: US 12,158,706 B2
(45) Date of Patent: Dec. 3, 2024

(54) LITHOGRAPHIC APPARATUS AND METHOD WITH IMPROVED CONTAMINANT PARTICLE CAPTURE

(71) Applicant: ASML NETHERLANDS B.V., Veldhoven (NL)

(72) Inventors: Marcus Adrianus Van de Kerkhof, Helmond (NL); Manish Ranjan, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/624,901

(22) PCT Filed: Jun. 4, 2020

(86) PCT No.: PCT/EP2020/065529
§ 371 (c)(1),
(2) Date: Jan. 5, 2022

(87) PCT Pub. No.: WO2021/004704
PCT Pub. Date: Jan. 14, 2021

(65) Prior Publication Data
US 2022/0276573 A1    Sep. 1, 2022

(30) Foreign Application Priority Data
Jul. 9, 2019    (EP) .................................. 19185209

(51) Int. Cl.
*G03F 7/00*    (2006.01)
(52) U.S. Cl.
CPC ................ *G03F 7/70875* (2013.01)

(58) Field of Classification Search
CPC .................................................. G03F 7/70875
See application file for complete search history.

(56) References Cited

U.S. PATENT DOCUMENTS

| 4,001,892 A | * | 1/1977 | Castelli | ................ G11B 23/505 |
| | | | | 360/137 |
| 5,019,933 A | * | 5/1991 | Karsh | .............. G11B 23/08785 |
| | | | | 15/DIG. 13 |

(Continued)

FOREIGN PATENT DOCUMENTS

| EP | 1457829 | 9/2004 | |
| WO | WO-2009069817 A2 | * 6/2009 | ............ G03F 7/702 |
| WO | 2018041599 | 3/2018 | |

OTHER PUBLICATIONS

International Search Report and Written Opinion issued in corresponding PCT Patent Application No. PCT/EP2020/065529, dated Sep. 24, 2020.

(Continued)

*Primary Examiner* — Hung V Nguyen
(74) *Attorney, Agent, or Firm* — Pillsbury Winthrop Shaw Pittman, LLP

(57) ABSTRACT

A lithographic apparatus including a substrate stage for supporting a structure in a compartment, the compartment having a compartment surface facing a top surface of the substrate in at least one operational configuration; and a soft coating on the compartment surface for capturing particles. A heat shield or component thereof for a lithographic apparatus, the heat shield or component thereof including a soft coating on at least one surface for capturing particles and a lithographic apparatus including such a heat shield.

20 Claims, 2 Drawing Sheets

(56) References Cited

U.S. PATENT DOCUMENTS

| | | |
|---|---|---|
| 5,085,899 A | 2/1992 | Nakagawa et al. |
| 5,884,009 A * | 3/1999 | Okase ............... H01L 21/67017 |
| | | 392/416 |
| 2005/0030504 A1 | 2/2005 | Terashima et al. |
| 2006/0261290 A1 | 11/2006 | Herpen et al. |
| 2009/0316129 A1 | 12/2009 | Butler et al. |
| 2013/0148200 A1 | 6/2013 | Ehm et al. |
| 2017/0212428 A1 | 7/2017 | Roos et al. |

OTHER PUBLICATIONS

Anonymous, "Research Disclosure", Research Disclosure, vol. 660, No. 50 (Apr. 1, 2019).

* cited by examiner

# LITHOGRAPHIC APPARATUS AND METHOD WITH IMPROVED CONTAMINANT PARTICLE CAPTURE

CROSS-REFERENCE TO RELATED APPLICATIONS

This application is the U.S. national phase entry of PCT Patent Application No. PCT/EP2020/065529 which was filed on Jun. 4, 2020, which claims priority of European Patent Application No. 19185209.4 which was filed on Jul. 9, 2019 and which is incorporated herein in its entirety by reference.

FIELD

The present invention relates to a lithographic apparatus and a method of lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Lithography is widely recognized as one of the key steps in the manufacture of ICs and other devices and/or structures.

In order to reduce the minimum printable size, imaging may be performed using radiation having a short wavelength. It has therefore been proposed to use an EUV radiation source providing EUV radiation within the range of 13-14 nm, for example. It has further been proposed that EUV radiation with a wavelength of less than 10 nm could be used, for example within the range of 5-10 nm such as 6.7 nm or 6.8 nm. Such radiation is termed extreme ultraviolet (EUV) radiation or soft x-ray radiation.

Overlay error indicates the discrepancy between the actual location of the reticle pattern imaged onto the wafer and the desired location. There is a threshold to this error beyond which the result of the imaging is not acceptable. The order of magnitude is nanometers (in EUV) and shrinking with each next generation of EUV scanners. The process involves putting a next patterned layer onto a previous patterned layer in a stack of tens of layers that together will constitute eventually the integrated electronic circuit. A lateral displacement of one layer with another one might give rise to these layers being not properly connected, making the circuit unacceptable for operational use.

A source of overlay error is wafer defectivity caused by (very small) particles impacting and sticking to the wafer resist. It would be desirable to mitigate the impact of these particles.

SUMMARY

According to a first aspect of the present invention, there is provided a lithographic apparatus comprising a substrate stage for supporting a structure in a compartment, said compartment having a compartment surface facing a top surface of the substrate in at least one operational configuration; and a soft coating on said compartment surface for capturing particles.

According to a second aspect of the present invention, there is provided a heat shield or component thereof for a lithographic apparatus comprising a soft coating on at least one surface for capturing particles.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
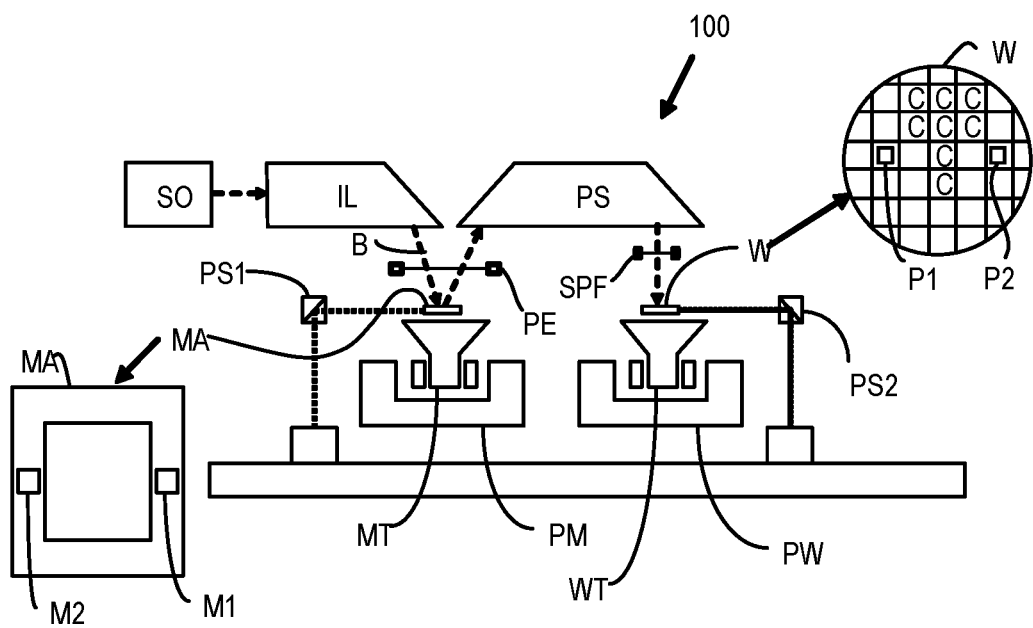
FIG. 1 depicts schematically a lithographic apparatus having reflective projection optics.

FIG. 1 schematically depicts a lithographic apparatus 100. The apparatus comprises:
- a source module SO;
- an illumination system (illuminator) IL configured to condition a radiation beam B (e.g. EUV radiation);
- a support structure (e.g. a mask stage) MT constructed to support a patterning device (e.g. a mask or a reticle) MA and connected to a first positioner PM configured to accurately position the patterning device;
- a substrate stage (e.g. a wafer stage) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may include a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate stages (and/or two or more mask stages). In such "multiple stage" machines the additional stages may be used in parallel, or preparatory steps may be carried out on one or more stages while one or more other stages are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as □-outer and □-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask stage) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate stage WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

An EUV membrane, for example a pellicle PE, is provided to prevent contamination of the patterning device from particles within the system. Such pellicles may be provided at the location shown and/or at other locations. A further EUV membrane SPF may be provided as a spectral purity filter, operable to filter out unwanted radiation wavelengths (for example DUV). Such unwanted wavelengths can affect the photoresist on wafer W in an undesirable manner. The SPF may also optionally help prevent contamination of the projection optics within projection system PS from particles released during outgassing (or alternatively a pellicle may be provided in place of the SPF to do this). Either of these EUV membranes may comprise any of the EUV membranes disclosed herein.

The depicted apparatus could be used in a variety of modes. In a scan mode, the patterning device support (e.g., mask stage) MT and the substrate stage WT are scanned synchronously while a pattern imparted to the radiation beam is projected onto a target portion C (i.e., a single dynamic exposure). The speed and direction of the substrate stage WT relative to the patterning device support (e.g., mask stage) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate stage WT is moved or scanned.

Combinations and/or variations on the above described modes of use or entirely different modes of use may also be employed.

Figure 2:
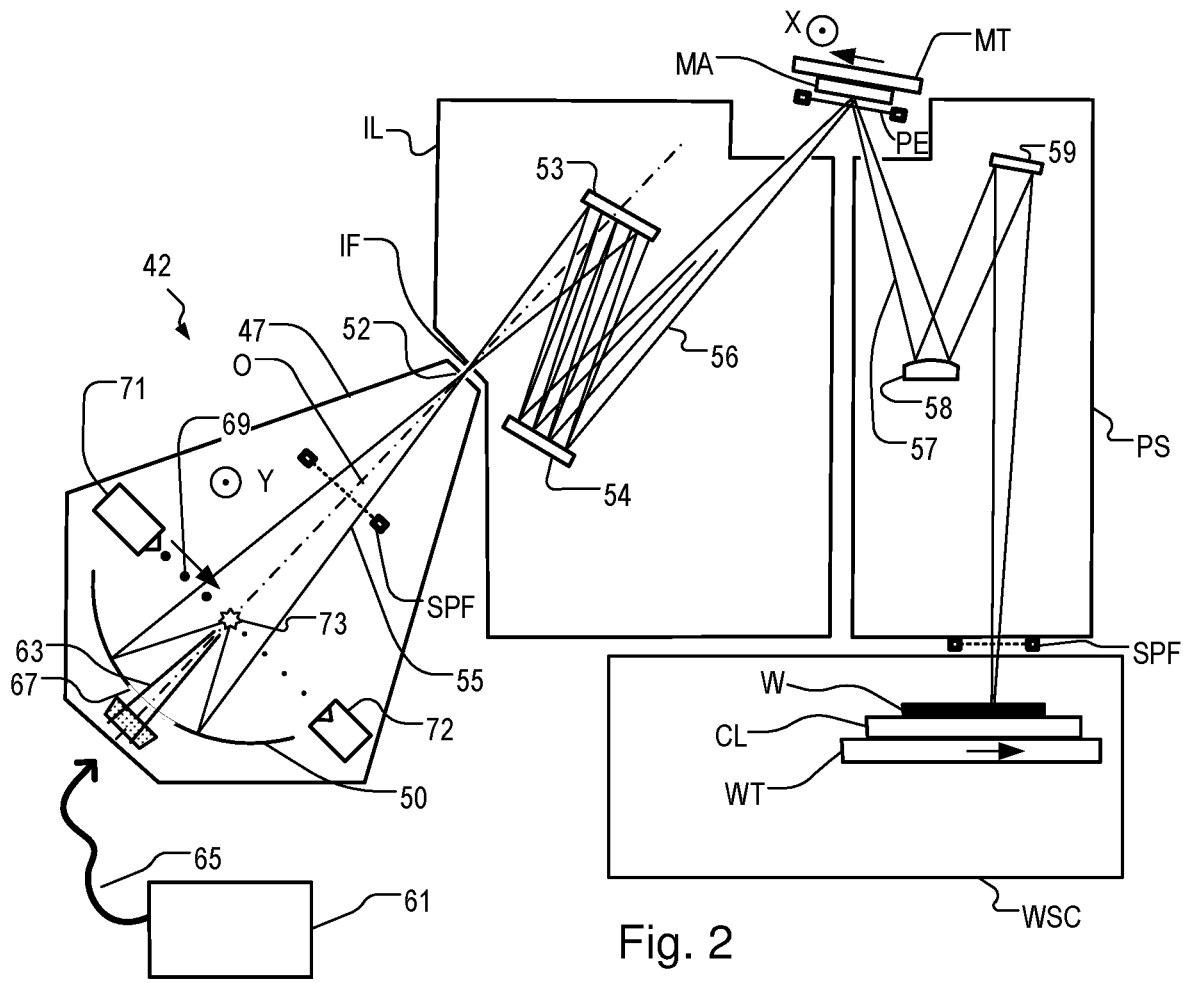
FIG. 2 is a more detailed view of the apparatus of FIG. 1 with a wafer-stage compartment.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a very hot plasma created from, for example, xenon (Xe), lithium (Li) or tin (Sn). In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector 50 which, in the example of FIG. 2, is a normal-incidence collector, for instance a multi-layer mirror.

As part of an LPP radiation source, a laser system 61 is constructed and arranged to provide a laser beam 63 which is delivered by a beam delivering system 65 through an aperture 67 provided in the collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. A trap 72 is provided on the opposite side of the source chamber 47, to capture fuel that is not, for whatever reason, turned into plasma. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. These create a highly ionized plasma with electron temperatures of several 105 K. The energetic radiation generated during de-excitation and recombination of these ions includes the wanted EUV which is emitted from the plasma at position 73. The plasma formation position 73 and the aperture 52 are located at first and second focal points of collector 50, respectively and the EUV radiation is focused by the normal-incidence collector mirror 50 onto the intermediate focus point IF.

The beam of radiation emanating from the source chamber 47 traverses the illumination system IL via reflectors 53, 54, as indicated in FIG. 2 by the radiation beam 56. The reflectors direct the beam 56, via pellicle PE, onto a patterning device (e.g. reticle or mask) positioned on a support (e.g. reticle stage or mask stage) MT. A patterned beam 57 is formed, which is imaged by projection system PS via reflective elements 58, 59 onto a substrate carried by wafer stage or substrate stage WT. The substrate W is held on the substrate stage WT by an electrostatic clamp CL. The substrate stage WT with its camp CL is housed in a wafer-stage compartment WSC.

The projection system PS has projection optics mounted in a container (box) providing a specific low-pressure environment. This is known as a projection optics box (POB). The POB and the wafer-stage compartment WSC are separate environments. During exposure, the photoresist may be outgassing owing to the radiation received from the POB. These gasses should not reach the projection optics as they may contaminate the surfaces of the mirrors (the POB contains reflective optical components in EUV). Contamination may then interfere with the imaging. As such, these two compartments are separated from each other using a dynamic gas lock (DGL), which has a primary function of keeping the POB compartment clean.

More elements than shown may generally be present in illumination system IL and projection system PS. For example there may be one, two, three, four or even more reflective elements present, rather than the two elements 58 and 59 shown in FIG. 2.

As the skilled person will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA when describing the spatial relationships with reference to the patterning device and normal to the plane of substrate W when describing the spatial relationships with reference to the substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the local X axis is generally transverse to a scanning direction aligned with the local Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma may produce other wavelengths of radiation, for example in the infrared (IR), visible, UV (ultraviolet) and DUV (deep ultraviolet) ranges. There may also be IR radiation present from the laser beam 63. The non-EUV wavelengths are not wanted in the illumination system IL and projection system PS and various measures may be deployed to block the non-EUV radiation. As schematically depicted in FIG. 2, a spectral purity filter SPF may be applied upstream of the virtual source point IF, for IR, DUV and/or other unwanted wavelengths. In the specific example shown in FIG. 2, two spectral purity filters are depicted, one within the source chamber 47 and one at the output of the projection system PS.

Figure 3:
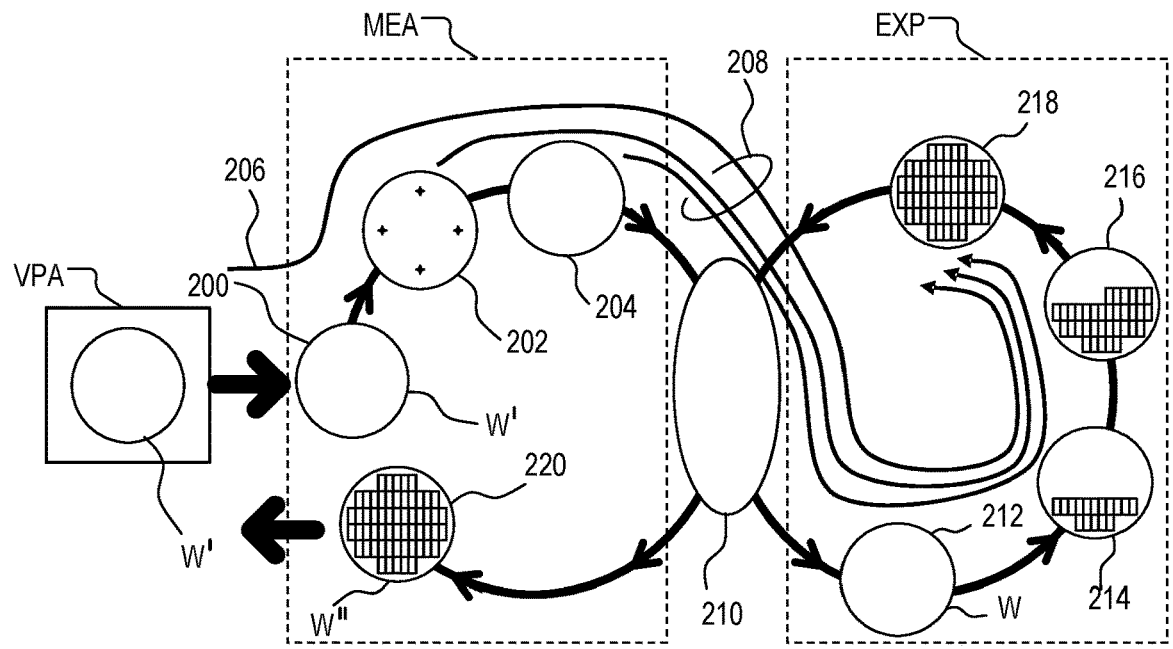
FIG. 3 illustrates schematically measurement and exposure processes in a dual-stage lithographic apparatus, according to known practice and modified in accordance with an embodiment of the present invention.

FIG. 3 illustrates the steps to expose target portions (e.g. dies) on a substrate W in a dual stage lithographic apparatus. The two substrate stages (also known as wafer stages) are configured to follow a route within the wafer-stage compartment (WSC in FIG. 2) in operational use of the lithographic apparatus. The substrate starts in a pre-aligner and is transferred to a substrate stage that holds the substrate in the clamp. The substrate is then conveyed along a route indicated by the steps 200, 202, 204, 210, 212, 214, 216, 218, 210 and 220.

The vacuum pre-aligner VPA is part of the wafer handler. The pre-aligner is a robot that puts the substrate W' into the correct orientation (in the local X-Y plane) so that the substrate W' has the correct orientation when transferred to the substrate stage at step 200 and is ready for the measure operation MEA.

Within the left-hand dashed box are steps performed at a measurement station MEA, while the right-hand side dashed box shows steps performed at the exposure station EXP. From time to time, one of the substrate stages WTa, WTb will be at the exposure station, while the other is at the measurement station, as described above. At step 200, a new substrate W' is loaded from the vacuum pre-aligner VPA by a mechanism not shown. These two substrates are processed in parallel (one at the measurement station and another one at the expose station) in order to increase the throughput of the lithographic apparatus. Note that the provision of a separate measurement station is entirely optional, and instead the measurement operation and exposure operation may be performed within a single station (e.g., with the substrate on a single stage).

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion type lithography tool, while others are exposed in a 'dry' tool or in a vacuum tool. Some layers may be exposed in a tool working at DUV wavelengths, while others are exposed using EUV wavelength radiation.

At 202, alignment measurements using the substrate marks P1 (depicted as four crosses) etc. and image sensors (not shown) are used to measure and record alignment of the substrate relative to substrate stages WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe data and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the substrate stages WTa and WTb within the apparatus, so that the substrates W, W' remain accurately clamped and positioned on those supports, to preserve relative alignment between the substrate stages and substrates themselves. Accordingly, once the stages have been swapped, determining the relative position between projection system PS and substrate stage WTb (formerly WTa) is all that is necessary to make use of the measurement information 202, 204 for the substrate W (formerly W') in control of the exposure steps. At step 212, reticle alignment is performed using mask alignment marks (not shown). In steps 214, 216, 218, scanning motions and radiation are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to eventually undergo etching or other processes, in accordance with the exposed pattern.

The skilled person will know that the above description is a simplified overview of a number of very detailed steps involved in one example of a real manufacturing situation. For example, rather than measuring alignment in a single pass, often there will be separate phases of coarse and fine measurement, using the same or different marks. The coarse and/or fine alignment measurement steps can be performed before or after the height measurement, or interleaved.

Embodiments may include a scanner with cooling hood or cooling device. The scanner has components with surfaces that are in line of sight of the wafer some time or another. The components are all thermally conditioned to have them assume the same temperature.

International patent application publication WO 2018/041599 is incorporated herein by reference. The publication discloses an EUV lithographic apparatus with a projection system which is configured to project via a slit a radiation beam, patterned by means of a mask, onto an exposure area on a substrate held on a substrate table. The substrate table is a component at the substrate stage and is in physical contact with the substrate and may be physically and functionally integrated with the electrostatic clamp that clamps the substrate to the substrate table. The electrostatic clamp has a cooling system to transport away heat generated at the clamp. The lithographic apparatus operates in a scanning mode, wherein the mask and the substrate are scanned synchronously during the projection. A radiation beam used to project a pattern onto a substrate delivers a substantial amount of heat to that substrate, which causes localized heating of the substrate. Localized expansion of the substrate caused by the heating reduces the accuracy with which a projected pattern overlies patterns already present on the substrate. To address this problem, the lithographic apparatus disclosed in WO 2018/041599 comprises a cooling device located between the projection system and the substrate. The cooling device provides localized cooling of the substrate in the vicinity of the area where the patterned radiation beam is incident on the substrate via the slit. In some embodiments, a pre-exposure calibration operation may be performed to ensure that the amount of cooling that is provided to the substrate by the cooling device is within a desired range. As the calibration operation need not be performed with high frequency, the calibration operation may utilize measurements obtained from a substrate table cooling system, in addition to, or rather than, measurements obtained from sensors near to a cooling surface of the cooling device.

It is desirable not to remove more heat from the substrate than is added by the radiation beam. WO 2018/041599 discloses that in some embodiments, therefore, thermal shielding is provided in order to reduce cooling in areas adjacent the exposure area. In an embodiment, the thermal shield is provided with one or more channels to allow the thermal shield to be cooled and/or heated by flowing a temperature regulation fluid through the channels. The flow of temperature regulation fluid through the one or more channels may be configured to maintain the thermal shield at an ambient temperature such as, for example, around 22° C.

The lithographic scanner has a cooling device for extracting from the wafer the heat, which is generated by absorption of the imaging radiation by the wafer. The cooling power of the cooling device should be controlled very accurately and the required cooling power depends on many parameters. The values of these parameters may vary per scenario and are taken into account in a Wafer Heating Feed Forward (WHFF) model, described below.

A mismatch between the heat extracted and the heat generated gives rise to thermally induced deformation of the wafer that causes overlay errors: unintended lateral displacement of the location of the pattern imaged with respect to the desired location.

The cooling device may be calibrated with respect to the imaging radiation received at the wafer. An example of a calibration mechanism used involves monitoring the difference between the temperature of the cooling water of the electrostatic clamp at the clamp's entrance and the temperature of the cooling water at the clamp's exit.

A temperature difference is indicative of the heat absorbed (or heat released) by the cooling water during its passing through the wafer-clamp. Ideally, the temperature difference of the cooling water between entrance and exit is representative of the mismatch between the heat extracted by the cooling device and the heat generated in the wafer by the radiation received from the imaging radiation beam.

However, the wafer-clamp's cooling water is also exposed to parasitic heat-loads, in addition to the heat load from the exposure radiation. Examples of components in the scanner that represent a parasitic heat load are those having a surface facing the wafer stage on its route through the wafer-stage compartment. As a result, the parasitic heat loads interfere with control of the heat extraction by the cooling device.

Figure 4:
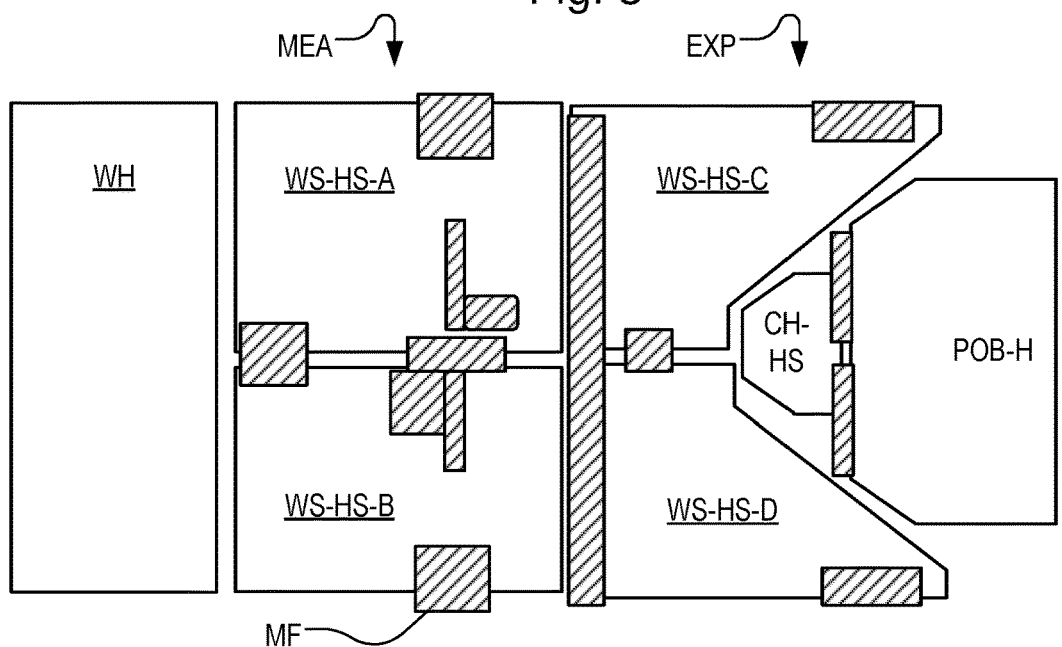
FIG. 4 depicts schematically a bottom-up view of the inside of a wafer-stage compartment of a lithographic apparatus.

FIG. 4 depicts schematically an example of a bottom-up view of the inside of a wafer-stage compartment of a lithographic apparatus. This is what would be seen looking up from the point of view of the wafer. The wafer handler WH is at the left-hand side. The vacuum pre-aligner VPA shown in FIG. 3 is part of the wafer handler. The measurement station MEA has a wafer-stage heat shield with two components WS-HS-A and WS-HS-B. The exposure station EXP has a wafer stage heat shield with two components WS-HS-C and WS-HS-D. Also, at the exposure station EXP, the cooling hood heat shield component CH-HS is shown next to the projection optics box hatch component POB-H. The exposure is performed through the gap between the cooling hood heat shield CH-HS and the projection optics box hatch POB-H. These components face different portions of the route followed by the wafer stage as described with reference to FIG. 3. Note that the specific heat shield arrangement shown is an exemplary arrangement used on a present apparatus. It is not required, for example, that the exposure station EXP wafer-stage heat shield comprises two components WS-HS-C and WS-HS-D. It may consist of a single item/component, or comprise more than two components. Similarly, the measurement station MEA wafer stage heat shield may also consist of a single item/component, or comprise more than two components; or else there may be no separate measurement stage at all (single stage scanner) and therefore no the measurement station MEA wafer stage heat shield.

The metrology frame MF is shown by cross-hatched elements. A metrology frame is a trustworthy sub-system that serves as a reference for metrology components, e.g., components that measure the position of the wafer stage accurately and that measure the topography of the wafer. The metrology frame is a mechanically very stiff construction that is kept at a stable and precise temperature so as to minimize inaccuracies in the measurements owing to thermally induced deformation of the metrology frame.

Figure 5:
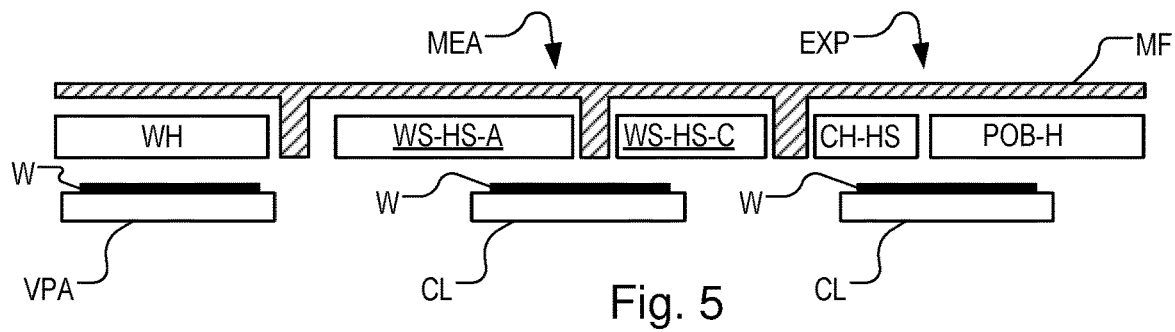
FIG. 5 depicts schematically a cross-section view of contents of a wafer-stage compartment of a lithographic apparatus.

FIG. 5 depicts schematically a cross-section view of contents of a wafer-stage compartment of a lithographic apparatus. The metrology frame MF is again shown with cross-hatching. The wafer handler has a component WH above the wafer W. It also has a component below the wafer, in the form of the vacuum pre-aligner VPA. Spanning the measurement station MEA and exposure station EXP, the wafer-stage heat shield components WS-HS-A and WS-HS-C are shown above the wafer W supported by the clamp CL. In the exposure station EXP, the cooling hood heat shield component CH-HS and projection optics box hatch component POB-H are shown above another wafer W supported by its respective clamp CL.

Wafer defectivity has a significant detrimental effect on yield in lithography exposure apparatuses such as scanners, and in particular EUV scanners. The critical particle size for wafer defectivity is, for example, about 10 nm for some present scanners and this is expected to reduce to, for example, about 5 nm. This miniscule size makes these particles extremely hard to detect and hard to influence, especially in the large, open, near-vacuum volume in which the two wafer stages move.

A main source of these particles is wear from the cable slab. The cable slab comprises the cable arrangement which connects each stage (e.g., wafer stage and reticle stage) to power and control sources. These stages are required to move aggressively to meet the high throughput requirements of current and future scanners, resulting in said wear. Another source of these particles comprises resist outgassing products and particle coagulation of these outgassing products.

Once generated, the particles move according to Brownian motion, or can be carried by gas flows, through the near-vacuum (the force due to gravity is negligible for approximately 10 nm particles and smaller), and bounce freely from the hard inert wall surfaces. The particles will however preferentially stick on the wafer resist surface. This resist surface is organic and relatively soft; particles contacting the resist surface are therefore more likely to stick rather than bounce.

To address this, it is proposed to apply a soft coating on said compartment surface for capturing particles, the compartment surface facing a top surface of the substrate in at least one operational configuration (e.g., during an exposure on the substrate), with a minimum distance between substrate surface and said compartment surface. More specifically, in an embodiment, it is proposed to apply the soft coating layer to the wafer compartment heat shields (e.g., those mounted above the wafer level). This should result in small particles, such those smaller than 500 nm (e.g., in the range of 5-500 nm or 10-500 nm), to stick to this surface rather than bounce and be captured. This will prevent the captured particles to reach and stick to the wafer resist top-layer. An alternative or additional option would be to apply the coating to a metro frame.

In an embodiment, a soft coating may be defined as having, for example, a hardness less than 80 Shore A, less than 70 Shore A, less than 65 Shore A, less than 60 Shore A, less than 55 Shore A or less than 50 Shore A (or equivalent); in practice the coating material may be selected with a compromise between softness and outgassing.

The soft coating is intended predominately to prevent particles which do not originate from the substrate itself, away from the substrate (e.g., the majority of particles captured do not originate from the substrate itself; for example: >50%, >60%, >70%, >80% of particles captured). This is done at a region close to substrate surface; i.e., a surface facing the substrate surface such as the heat shield surface. In principle, the facing surface may be any nearby facing surface if overlay considerations allow.

The wafer compartment heatshield(s) to which the soft coating is applied may comprise one or more of the heat shields illustrated in FIGS. 4 and 5. As such, the soft coating may be applied to some or all of the exposure station EXP wafer stage heat shield; for example some or all of the respective surfaces of either or both components WS-HS-C and WS-HS-D. Where the scanner is a two stage scanner comprising a measurement station (as illustrated), the soft coating may optionally also be applied to some or all of the measurement station MEA wafer stage heat shield; for example some or all of the respective surfaces of either or both components WS-HS-A and WS-HS-B. Also, optionally, the soft coating may be applied to some or all of cooling hood heat shield component CH-HS, although this may not be ideal as the coating may become subject to degeneration due to the EUV beam and resultant plasma products in that region.

The material used for the soft coating may comprise a soft polymer. In order to also satisfy the primary function of the heat shield (and thus prevent spurious overlay impact), the material chosen should have high IR absorption, e.g., emissivity should be greater than 60%. Soft polymers in principle have excellent, and therefore suitable, IR absorption. The soft polymer should be a solid polymer so as to avoid evaporation in the near-vacuum environment to which it will be subject.

Optionally, the soft polymer may be not completely crosslinked (e.g., polyurethane (PU) or thermoplastic polyurethane (TPU)), to enhance sticking probability. Another suitable material may comprise a polyimide, such as Kapton (registered trademark). In an embodiment, the soft material (e.g., polymer) used may be less than 95%, less than 90%, less than 85%, less than 80% or less than 75% crosslinked.

While a soft polymer is, in itself, sufficient to capture low-velocity drifting particles, the soft coating may optionally also be adhesive (sticky) or tacky to further enhance particle capture. Tackiness is a property associated with high surface energy (e.g., interfacial free surface energy), which in most polymers would be the result of partial crosslinking (so a number of available bonding sites still available on the surface of the polymer), or from chemically active end sections. Suitable values for surface energy for a tacky surface would be greater than 30 mN/m, greater than 35 mN/m, greater than 40 mN/m or greater than 45 mN/m. Alternatively or additionally, the soft coating may (again optionally) be foamy (or more generally open structured) to also or further enhance particle capture.

As already mentioned, the soft material should be a solid material. The soft material may comprise, for example, the form of a solid film, or a foamy (open-structured) material. While a foamy material may have the best particle capture properties it will be more difficult to apply and handle. Solid film would also be easier to clean. For example, it could be cleaned by application and removal of an adhesive tape (which should be more sticky than the soft material but not too sticky to risk film removal).

The current coating process for wafer-stage heat shields is not yet an industrialized process. This leads to high cost, and a design which is not robust (e.g., shows variability from machine to machine). The current process often results in undesirable amount of waste, due to the coating process still being under development and not yet necessarily sufficiently robust. Therefore, the proposal disclosed herein has the additional advantage of improving the wafer-stage heat shield coating process, while also providing the already present wafer-stage heat shields with an additional use.

Therefore, it is proposed herein to use a soft, and optionally sticky or foamy, coating or film to a heat shield surface to capture particles smaller than 500 nm as these float and bounce through the wafer-stage compartment. The coating should have good IR absorption to maintain thermal management and good overlay. In addition, the coating may also capture resist outgassing products to reduce contamination rate of wafer-level sensors and wafer stage edge.

A coating such as a sticky film can be developed as an add-on layer on a pre-existing heat shield. Therefore, such a coating can be applied in-field, e.g., as an upgrade. Furthermore such a film can be configured to be replaced as and when desired (e.g., at a suitable planned service action). Such implementation may relax the cleanability requirement.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following clauses and their equivalents.

1. A lithographic apparatus comprising a substrate stage for supporting a substrate in a compartment, said compartment having a compartment surface facing a top surface of the substrate in at least one operational configuration; and a soft coating on said compartment surface for capturing particles.
2. A lithographic apparatus as claimed in clause 1, wherein said compartment surface comprises a heat shield surface of a heat shield.
3. A lithographic apparatus as claimed in clause 2, wherein said heat-shield comprises two or more heatshield components and said coating is applied to a heat shield surface of at least one of said heat-shield components.
4. A lithographic apparatus as claimed in clause 2 or 3, further comprising a cooling device for cooling the substrate stage; and wherein said heat shield is operable to reduce cooling by said cooling device in at least an area adjacent an exposure area.
5. A lithographic apparatus as claimed in clause 1, wherein said compartment surface comprises a surface of a metrology frame.
6. A lithographic apparatus as claimed in any preceding clause, wherein said soft coating is adhesive and/or tacky.
7. A lithographic apparatus as claimed in clause 6, wherein the soft coating has a surface energy greater than 35 mN/m.
8. A lithographic apparatus as claimed in clause 6, wherein the soft coating has a surface energy greater than 45 mN/m.
9. A lithographic apparatus as claimed in any preceding clause, wherein said soft coating is open structured and/or foamy.
10. A lithographic apparatus as claimed in any of clauses 1 to 8, wherein said soft coating is a film.
11. A lithographic apparatus as claimed in any preceding clause, wherein said soft coating comprises a soft polymer.
12. A lithographic apparatus as claimed in clause 11, where said polymer is not completely crosslinked.
13. A lithographic apparatus as claimed in clause 10 or 12, wherein said polymer comprises one of polyurethane, thermoplastic polyurethane or a polyimide.
14. A lithographic apparatus as claimed in any preceding clause, wherein said soft coating is solid state.
15. A lithographic apparatus as claimed in any preceding clause, further comprising projection optics configured to project a patterned beam of radiation onto a target portion of the substrate held on a clamp on said wafer stage in said compartment.
16. A lithographic apparatus as claimed in any preceding clause, wherein said soft coating comprises an emissivity greater than 60%.
17. A lithographic apparatus as claimed in any preceding clause, wherein a majority of said particles comprise particles which do not originate from the substrate itself.
18. A lithographic apparatus as claimed in any preceding clause, wherein said soft coating has a hardness less than 60 Shore A.
19. A lithographic apparatus as claimed in any of clauses 1 to 17, wherein said soft coating has a hardness less than 50 Shore A.
20. A heat shield or component thereof for a lithographic apparatus comprising a soft coating on at least one surface for capturing particles.
21. A heat shield or component thereof as claimed clause 20, being operable for reducing cooling by a cooling device in at least an area adjacent an exposure area during an exposure performed by the lithographic apparatus.
22. A heat shield or component thereof as claimed in clause 20 or 21, wherein said soft coating is adhesive and/or tacky.
23. A heat shield or component thereof as claimed in any of clauses 20 to 22, wherein said soft coating is open structured and/or foamy.
24. A heat shield or component thereof as claimed in any of clauses 20 to 22, wherein said soft coating is a film.
25. A heat shield or component thereof as claimed in any of clauses 20 to 24, wherein said soft coating comprises a soft polymer.
26. A heat shield or component thereof as claimed in clause 25, where said polymer is not completely crosslinked.
27. A heat shield or component thereof as claimed in clause 25 or 26, wherein said polymer comprises one of polyurethane, thermoplastic polyurethane or a polyimide.
28. A heat shield or component thereof as claimed in any of clauses 20 to 27, wherein said soft coating is solid state.
29. A heat shield or component thereof as claimed in any of clauses 20 to 28, wherein said soft coating comprises an emissivity greater than 60%.
30. A lithographic apparatus comprising the heat shield or component thereof as claimed in any of clauses 20 to 29.

The invention claimed is:
1. A compartment for a lithographic apparatus, the compartment comprising:
a substrate stage configured to support a resist-coated substrate in the compartment, the compartment having a compartment surface facing a top surface of the substrate, when supported on the substrate stage, in at least one operational configuration;
a path of particles that do not originate from the substrate; and
a soft coating on the compartment surface configured to capture particles, the soft coating located in or along the path to predominately capture such particles than particles from the substrate.
2. The compartment as claimed in claim 1, wherein the compartment surface comprises a heat shield surface of a heat shield.
3. The compartment as claimed in claim 1, wherein the compartment surface comprises a surface of a metrology frame.
4. The compartment as claimed in claim 1, wherein the soft coating has a surface energy greater than 35 mN/m.
5. A lithographic apparatus comprising the compartment as claimed in claim 1, and comprising projection optics configured to project a patterned beam of radiation onto a target portion of the substrate when held on a clamp on the substrate stage in the compartment.
6. The compartment as claimed in claim 1, wherein the soft coating has a hardness less than 60 Shore A.
7. The compartment as claimed in claim 1, wherein the soft coating is open structured and/or foamy.
8. The compartment as claimed in claim 1, wherein the soft coating is a film, comprising a soft polymer, and/or comprises a polymer comprising polyurethane, thermoplastic polyurethane, or a polyimide.
9. The compartment as claimed in claim 1, wherein the soft coating comprises an emissivity greater than 60%.
10. A lithographic apparatus comprising the compartment as claimed in claim 1.
11. A compartment for a lithographic apparatus, the compartment comprising:
a volume configured to contain a substrate stage, wherein the substrate stage is configured to support a resist-coated substrate in the compartment and the compartment has a compartment surface facing a top surface of the substrate, when supported on the substrate stage, in at least one operational configuration;

a path of particles that do not originate from the substrate; and a soft coating on the compartment surface configured to capture particles, the soft coating located in or along the path to predominately capture such particles than particles from the substrate.

12. The compartment as claimed in claim 11, wherein the compartment surface comprises a heat shield surface of a heat shield of the compartment.

13. The compartment as claimed in claim 11, wherein the soft coating has a surface energy greater than 35 mN/m.

14. The compartment as claimed in claim 11, wherein the soft coating has a hardness less than 60 Shore A.

15. The compartment as claimed in claim 11, wherein the soft coating is open structured and/or foamy.

16. The compartment as claimed in claim 11, wherein the soft coating is adhesive and/or tacky.

17. A lithographic apparatus comprising the compartment as claimed in claim 11.

18. A compartment for a lithographic apparatus, the compartment comprising:

a volume configured to contain a substrate stage, wherein the substrate stage is configured to support a substrate in the compartment and the compartment has a compartment surface facing a top surface of the substrate, when supported on the substrate stage, in at least one operational configuration; and a soft coating on the compartment surface configured to capture particles, wherein the soft coating has a surface energy greater than 35 mN/m and/or or has a hardness less than 60 Shore A.

19. The compartment as claimed in claim 18, comprising the substrate stage.

20. The compartment as claimed in claim 18, wherein the soft coating comprises an emissivity greater than 60%.

* * * * *